United States Patent [19]

Berg et al.

[11] 4,326,778

[45] Apr. 27, 1982

[54] ACOUSTO-OPTIC TIME INTEGRATING CORRELATOR

[75] Inventors: Norman J. Berg, Baltimore; Michael W. Casseday, Greenbelt; John N. Lee, Silver Spring; Irwin J. Abramovitz, Baltimore, all of Md.

[73] Assignee: The United States of America as represented by the Secretary of the Army, Washington, D.C.

[21] Appl. No.: 148,653

[22] Filed: May 12, 1980

[51] Int. Cl.[3] .......................... H03H 9/25; G02F 1/33

[52] U.S. Cl. ...................................... 350/358; 350/169

[58] Field of Search ...................... 350/358, 169, 96.13, 350/96.14; 235/181; 333/150

[56] References Cited

U.S. PATENT DOCUMENTS 4,110,016 8/1978 Berg et al. .......................... 350/358

4,124,280 11/1978 Berg et al. .......................... 350/358

*Primary Examiner*—William L. Sikes

*Attorney, Agent, or Firm*—Nathan Edelberg; Robert P. Gibson; Saul Elbaum

[57] ABSTRACT

A highly efficient time integrating acousto-optic correlator which determines the time difference of arrival of the signals being correlated as well as the center frequency and bandwidth of the signals. A surface acoustic wave delay line is provided with two counter-propagating surface acoustic waves with wavefronts tilted with respect to each other. Two laser beams are directed across the propagating waves with an angle of $4\theta_\beta$ between them where $\theta_\beta$ is the Bragg angle, so that one beam interacts primarily with one propagating wave while the other beam interacts primarily with the other wave. The modulated optical beams are directed to a time-integrating photodetector means which provides a signal output corresponding to the correlation function.

8 Claims, 6 Drawing Figures

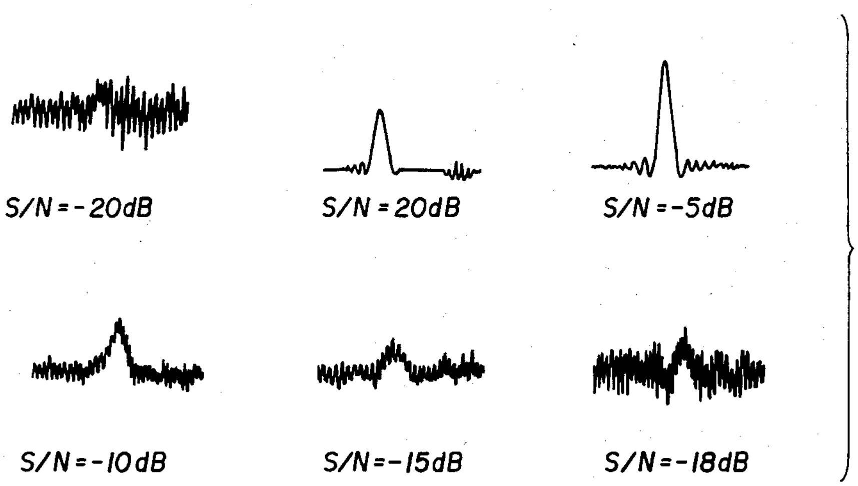
FIG. 2
FIG. 3
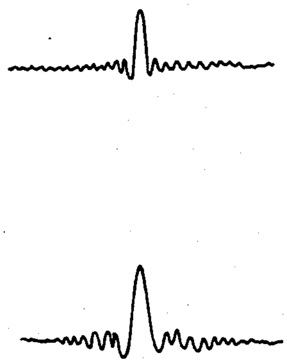
TOP TRACE: 5 MHz CHIRP
BOTTOM TRACE: 2.5 MHz CHIRP
FIG. 4
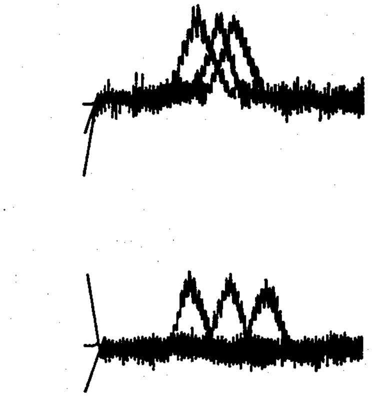
PULSE 1: 110 ns (260 ns) DELAY
PULSE 2: NO DELAY
PULSE 3: 110 ns (260 ns) ADVANCE
FIG. 5
CORRELATION 5 MBIT/SEC } TOP: 300 MHz
BOTTOM: 306 MHz
FIG. 6
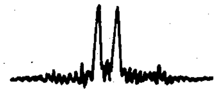
FFT

ACOUSTO-OPTIC TIME INTEGRATING CORRELATOR

The invention described herein may be manufactured, used, and licensed by or for the United States Government for governmental purposes without the payment to me of any royalty thereon.

The present invention is directed to a surface wave acousto-optic time integrating correlator.

As is known, the correlation function serves many useful purposes in the processing of radar and communications signals. Specifically, it is most useful when attempting to extract weak signals from a noisy environment, such as radar return signals, and in the process of synchronizing a spread spectrum communications system.

The gain of a signal processing system is essentially proportional to the time-bandwidth product thereof, where time refers to the integration time, and this product is a figure of merit of the processor. The interaction time, which may be different than the integration time, is the specific time window which is being simultaneously integrated, and in general, it is desirable to maximize the interaction time as well as the time-bandwidth product.

One type of correlator which has been developed in recent years is the surface wave acousto-optic type device, exemplified in U.S. Pat. Nos. 4,110,016, 4,139,277 and 4,024,280. In such a device high frequency acoustic waves having envelopes corresponding to the signals to be correlated are propagated down piezoelectric crystals such as lithium niobate while a laser beam is directed across the crystals. The acoustic waves of the signals to be correlated diffract the coherent light, and upon suitable detection, the correlation function of the two signals is obtained.

One limitation of the above-described type of device is that it is often limited to use with signals having durations which are shorter than the interaction time of the device. The reason for this limitation is that the correlation integration is performed over a limited spatial variable, such as the length of the crystal delay line.

In accordance with the present invention, an acousto-optic apparatus which integrates over time instead of over space is provided. A surface acoustic delay line such as is described in the above-mentioned patents is utilized, but is provided with two counter-propagating surface acoustic waves with the wavefronts tilted with respect to each other which are generated at the respective ends of the crystal. Two laser beams are directed across the propagating waves with an angle of $4\theta_\beta$ between them where $\theta_\beta$ is the Bragg angle so that one beam interacts primarily with one propagating wave while the other beam interacts primarily with the other wave. The modulated optical beams are directed to a time integrating photodetector means which provides a signal output corresponding to the correlation function.

The resulting device is an extremely efficient time integrating correlator, having large processing gains in excess of $10^6$. Additionally, the device is capable of simultaneously determining the time difference of arrival (TDOA) of the signals and the center frequency and bandwidth of transmission, and can make such determinations in a multi-signal environment.

It is therefore, an object of the invention to provide a highly efficient time integrating correlator.

It is a further object of the invention to provide a time integrating correlator which determines the time difference of arrival of the signals being correlated.

It is still a further object of the invention to provide a time integrating correlator which determines the center frequency and bandwidth of transmission, and which does so in a multi-signal environment.

It is still a further object of the invention to provide an acousto-optical time integrating correlator which provides for the propagation of both signals to be correlated on the same crystal substrate, thus resulting in a compact, stable system having good matching of optical wavefronts.

The invention will be better understood by referring to the accompanying drawings in which:

FIG. 2 is a series of graphical representations which show the correlation peak obtained for a 5.0 Mbit/s pseudonoise (PN) biphase-coded signal with signal-to-noise ratios varying from +20 dB to −20 dB.

FIG. 3 is a graphical representation depicting the correlation output for linear FM chirp input signals.

FIG. 4 is a graphical representation depicting how the position of the correlation peak indicates the time difference of arrival (TDOA) of two signals.

FIG. 5 is a graphical representation depicting how the correlation pattern can be used to determine the center frequency of a broadband signal.

FIG. 6 is a graphical representation of the fast Fourier transform of the fringe pattern of FIG. 5.

Figure 1:
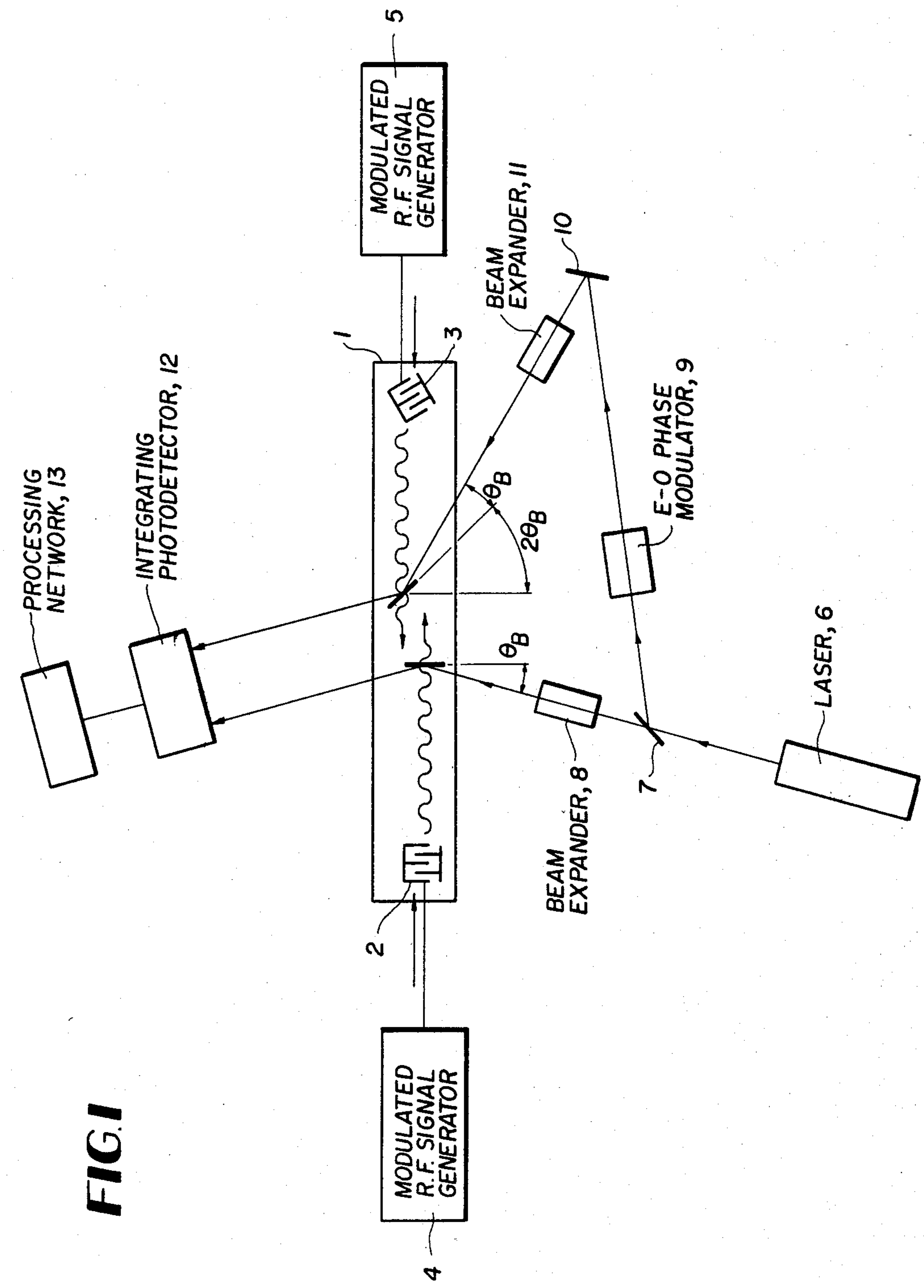
FIG. 1 is a schematic representation of an embodiment of the invention.

Referring to FIG. 1, acousto-optic crystal 1 is provided, which for example may be made of lithium niobate. Acoustic transducers 2 and 3 are disposed at respective ends of the crystal, and are oriented so that the wavefronts of the acoustic waves propagated by the transducers are tilted with respect to each other. Specifically, the transducers on the delay line are fabricated so that one is tilted relative to the other by the angle $2\theta_{\beta n}$ where $\theta_{\beta n}=\sin^{-1}[\lambda_l/(2\lambda\alpha_n)]$, and n is the index of refraction of the delay line material, $\lambda_l$ is the light wavelength and $\lambda_\alpha$ is the acoustic wavelength at the design center frequency. For a more detailed discussion of acoustic media, acoustic transducers, and acoustic-optic phenomenon in general, the reader is referred to the above-mentioned U.S. Pat. Nos. 4,110,016, 4,139,277 and 4,124,280, which are incorporated herein by reference.

Referring again to FIG. 1, acoustic transducers 2 and 3 are excited with respective modulated R.F. signals at the same R.F. frequency but each have a respective modulation impressed thereon corresponding to one of the two signals to be correlated. In FIG. 1, the signal which is applied to transducer 2 is provided by generator 4 while the signal which is applied to transducer 3 is provided by generator 5.

A coherent light beam is produced by laser 6, and is split into two beams by beams splitter 7. After being acted on by beam expander 8, which may be a configuration of lenses designed to provide a wide narrow beam, one of the beams traverses the surface portion of crystal 1, while the other beam is fed through E-O phase modulator 9, reflected off mirror 10 and acted on by beam expander 11 before it too is incident on the surface of the crystal. The purpose of E-O modulator 9 is to compensate for the differing path lengths of the two beams, to ensure that they reach the crystal with respective wavefronts in phase.

The optical components are arranged so that the two beams enter the delay line with an angle of $4\theta_\beta$ between them where the Bragg angle $\theta_\beta=\sin^{-1}[\lambda_l/(2\lambda_a)]$. As a result of this strong angular dependence of the acousto-optic interaction, the right hand laser beam in FIG. 1 interacts primarily with the surface acoustic wave which is launched by the right hand transducer while the left hand light beam in the Figure interacts primarily with the wave launched by the left hand transducer.

The acoustic waves are effective to shift the frequencies of the respective optical beams which are diffracted thereby, and for the geometry shown, the first order diffracted beams are both frequency shifted in the same sense. That is, if the laser light is of the form cos $\omega_l t$, where $\omega_l=[(2\pi c)/\lambda_l]$, then both first order beams will be of the form cos $(\omega_l-\omega_a)t$, where $\omega_a=(2\pi v_a)/\lambda_a$, c is the velocity of light, and $v_a$ is the velocity of the sound-wave.

At the design center frequency ($f_o$), the two first order diffracted beams are parallel but as the frequency of the acoustic waves is shifted away from $f_o$, the two first order beams diverge. The phase of the first order diffracted beams is dependent on the relative phases of the surface acoustic wave.

In accordance with the invention, both of the diffracted light beams are imaged onto a square law diode detector array 12, and the light amplitude at each diode at any distant lies somewhere between a maximum and minimum value, as in an optical interferometer, depending on the relative amplitude and phases of the acoustic waves. The diode array is arranged to integrate over some period of time, and the final array output contains the cross correlation of the modulation signals of the surface acoustic waves.

This output is actually the correlation function on a pedestal, and to remove the pedestal, two successive integrations, each over said period of time are performed, the first being a regular integration as described above, and the second being an integration where the phase of one of the incident light beams is changed by 180° with the phase modulator. The second integration is subtracted from the first in processing network 13 to effectively remove the pedestal.

When the above technique for removing the pedestal is used an error results due to changes in the signal from stray light from the two laser beams interfering constructively and destructively on successive integrations. An alternative method of obtaining the second integration is to change the phase of one of the R.F. signals by 180° instead of changing the phase of a light beam, and this may be effected by mixing a square wave with the R.F. input to obtain the normal R.F. input for the first integration, and the normal R.F. input inverted for the second integration.

An acousto-optic time integrating correlator in accordance with the invention has actually been built. In this actual embodiment, a surface acoustic wave delay line fabricated from single crystal Y-Z cut lithium niobate served as the interaction medium while a delay line center frequency of 300 MHz, with a 30 MHz instantaneous bandwidth and a 10-$\mu$s delay time was used. The light source was a 3 mW He-Ne gas laser at 632.8 nm and the detector was a 1024 element self-scanning integrating photodiode array. In experiments performed, the integration time was varied from 3 to 30 ms.

FIG. 2 are graphs of the correlation peak which was obtained for a 5.0 Mbit/s pseudonoise (PN) biphase coded signal with the signal to noise ratio varying from +20 dB to −20 dB. To obtain these measurements, both inputs to the correlator were simultaneously degraded by the addition of independent white noise. That is, a signal to noise ratio of −10 dB means that both input signals were degraded to this signal to noise ratio. As is illustrated, a correlation output was observable when the signal to noise ratio of both inputs was −20 dB. Correlation was observed between two inputs at their maximum power levels when one input was noise free and the other had a signal to noise ratio as low as −40 dB. The input dynamic range, operating in a bilinear mode in the absence of noise, was 24 dB: that is, both input signals were noise-free and were 24 dB below their maximum input power level.

FIG. 3 illustrates the correlation output for identical linear FM chirp input signals of 10 ms duration. 5 MHz total FM is shown in the top section of the figure while 2.5 MHz total FM is shown in the bottom section.

FIG. 4 illustrates an additional important property of the correlator of the invention, which is that it can accurately indicate the time difference of arrival (TDOA) of two signals by the position of the correlation peak. In the case of both the top and bottom sections of the figure, the central peak represents the correlation of 5.0 Mbit/s PN code with no delay on either input. The right and left peaks are the outputs for a time delay inserted into either left or right inputs, which for the top trace is 110 ns and for the bottom, 260 ns. The present device can resolve TDOA to better than 30 ns.

The time integrating correlator of the invention can also be used to determine the center frequency of a broadband signal. If the broadband signal center frequency is at or near the design frequency at which the two first order light beams are co-linear, than a correlation pattern as shown in FIG. 2 results. If, however, the signal center frequency shifts sufficiently, then the resulting angular divergence between the two beams results in a fringe pattern at the photodiode array which is superimposed on the correlation peak, as is shown in FIG. 5. The top trace is for an RF signal centered at 300 MHz while the bottom trace is for a signal centered at 306 MHz. The spatial frequency offset, and a simple fast Fourier transform (FFT) of the fringe pattern with an appropriate scale factor can yield the frequency offset. A trace of the FFT of the fringe pattern of FIG. 5 is shown in FIG. 6, and it is noted that the present accuracy for center-frequency determination is about 5% of the broadband signal bandwidth, which conceivably could be improved to about 1% with a higher accuracy FFT. Signal bandwidth is obtainable from the width of the correlation peak or from the width of the fringe pattern FFT.

I wish it to be understood that I do not desire to be limited to the exact details of construction shown and described, for obvious modifications can be made by a person skilled in the art.

We claim:

1. A surface wave acousto-optic time integrating correlator apparatus for correlating first and second electrical signals, comprising:

an acousto-optic interaction medium, first and second acoustic transducer means disposed on the surface of said acousto-optic interaction medium, means for applying a first high frequency A.C. signal to said first acoustic transducer means for causing a first acoustic wave to propagate along the surface of said medium, the envelope of said first A.C. signal corresponding to said first electrical signal, means for applying a second high frequency A.C. signal to said second acoustic transducer means for causing a second acoustic wave to propagate along the surface of said medium, the envelope of said second A.C. signal corresponding to said second electrical signal.

means for directing a first laser light beam across said medium for interacting primarily with said first propagating acoustic wave, means for directing a second laser light beam across said medium for interacting primarily with said second propagating acoustic wave, a time integrating photodetector means, and means for directing both said first and second beams at said photodetector means after they have traversed said acousto-optic interaction medium.

2. The apparatus of claim 1, wherein said acousto-optic interaction medium is a crystal having a long dimension, which separates the ends of said crystal, each of said acoustic transducer means being disposed near a different one of said ends.

3. The apparatus of claim 2, wherein said acoustic transducer means are oriented so that the wavefronts of sid first and second acoustic waves are at an angle to each other.

4. The apparatus of claim 3, wherein said first laser beam is directed at said medium so that it makes an angle equal to the Bragg angle with the wavefronts of said first propagating acoustic wave.

5. The apparatus of claim 4, wherein said second laser beam is directed at said medium so that it makes an angle equal to the Bragg angle with the wavefronts of said second propagating acoustic wave.

6. The apparatus of claim 5, wherein said first and second laser beams which are incident on said medium make an angle of four times the Bragg angle with respect to each other.

7. The apparatus of claim 6, wherein said photodetector means comprises an array of photodetectors.

8. The apparatus of claim 7, wherein said first and second laser beams are generated by the same laser light source.

* * * * *